(12) United States Patent
Tsuei

(10) Patent No.: US 7,541,253 B1
(45) Date of Patent: Jun. 2, 2009

(54) METHOD OF FORMING AN INTEGRATED RESISTOR

(75) Inventor: Gu-Fung David Tsuei, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 248 days.

(21) Appl. No.: 11/243,779

(22) Filed: Oct. 5, 2005

(51) Int. Cl.
*H01L 21/20* (2006.01)
(52) U.S. Cl. .............................. 438/384; 257/E21.004; 438/381
(58) Field of Classification Search ................ 438/330, 438/381.384; 257/E21.004
See application file for complete search history.

(56) References Cited

U.S. PATENT DOCUMENTS

| | | | | |
|---|---|---|---|---|
| 5,945,257 | A | * | 8/1999 | Doeling ...................... 430/313 |
| 6,110,826 | A | * | 8/2000 | Lou et al. ................... 438/674 |
| 6,171,899 | B1 | * | 1/2001 | Liou et al. .................. 438/240 |
| 6,940,147 | B2 | * | 9/2005 | Crawford et al. ............ 257/531 |
| 7,186,639 | B2 | * | 3/2007 | Lee ............................. 438/618 |
| 2002/0016078 | A1 | * | 2/2002 | Ionov et al. ................. 438/710 |
| 2005/0104107 | A1 | * | 5/2005 | Fazan et al. ................. 257/296 |
| 2005/0186796 | A1 | * | 8/2005 | Lin et al. .................... 438/688 |
| 2005/0263769 | A1 | * | 12/2005 | Chul Ahn .................... 257/72 |
| 2007/0045693 | A1 | * | 3/2007 | Manning et al. ............ 257/296 |

* cited by examiner

*Primary Examiner*—Asok K Sarkar
(74) *Attorney, Agent, or Firm*—Jurgen K. Vollrath; Vollrath & Associates

(57) ABSTRACT

In a semiconductor device, a thin film resistor is formed by making use of an interconnect structure and etching back the layers over the glue layer of the interconnect structure and using the glue layer as a thin film resistor.

19 Claims, 1 Drawing Sheet

METHOD OF FORMING AN INTEGRATED RESISTOR

FIELD OF THE INVENTION

The invention relates to resistors used in integrated circuits. In particular it relates to thin film resistors and methods of making thin film resistors.

BACKGROUND OF THE INVENTION

Resistors used in integrated circuits (ICs) are commonly formed as thin film resistors in which SICC (Silicon Carbide Chrome) material is formed to 75-100 Angstroms. Not only are these thicknesses extremely small, but the etching of SICC material is also hard. As a result, the issue of resistance matching and achieving accurate resistance and capacitance figures makes the process difficult and expensive.

SUMMARY OF THE INVENTION

According to the invention, there is provided a method of forming an integrated resistor, comprising forming an metal base interconnect (e.g. an aluminum base interconnect or copper base interconnect) that includes a glue layer, a metal body (e.g. aluminum or copper body) and an anti-reflective coating (ARC) layer, and etching away the ARC layer and at least part of the metal body. The method may further comprise etching away all of the metal body. The method may also comprise etching away part of the glue layer. In the case of an aluminum body, the metal body may comprise AlCu, and the glue layer may comprise TiN or TiW, formed on top of Ti. The Ti may comprise a seeding layer that may be 100 Å in thickness. The TiN or TiW layer may be 200 Å in thickness prior to etching. The ARC layer may comprise a TiN layer and is preferably etched using a dry etch process. In the case of an aluminum body comprising AlCu material, the body is preferably etched using a wet etch process. The etching steps typically include depositing a photoresist and patterning the resistor section prior to dry and wet etching. Any etching of the TiN or TiW of the glue layer may include dry etching the TiN or TiW of the glue layer.

DETAILED DESCRIPTION OF THE INVENTION

Figure 1:
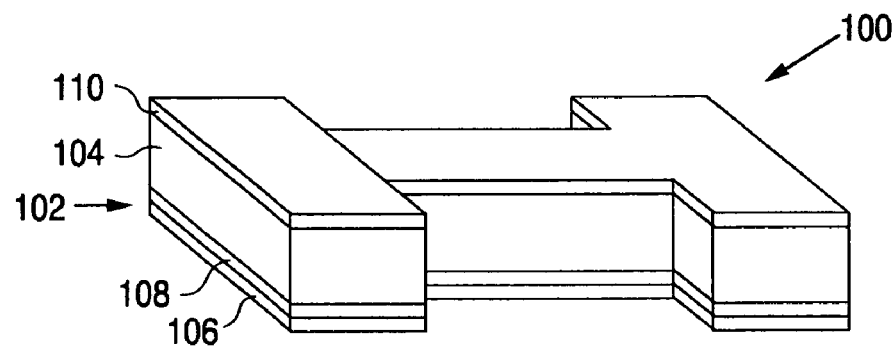
FIG. 1 shows a three dimensional view of aluminum base interconnect used in forming integrated resistor structure of one embodiment of the invention.

FIG. 1 shows a typical aluminum base interconnect after standard metal etch, as is commonly known in the art. While an aluminum base interconnect is described below, it will be appreciated that the invention applies also to other interconnects such as copper based interconnects. The interconnect 100 includes a seed or glue layer 102 on which the AlCu material of the aluminum base 104 is formed. The glue layer 102 shown in FIG. 1 includes a Ti layer 106 which is 100 Å in thickness, and a TiN layer 108 that is 200 Å in thickness. It will be appreciated that this is merely one type of aluminum interconnect known in the art. For example, the layer 108 may instead comprise TiW material. The AlCu material of the aluminum base 104 is typically protected by an anti-reflective coating (ARC) layer 110, which in this case comprises a 250 Å thick TiN layer.

Figure 2:
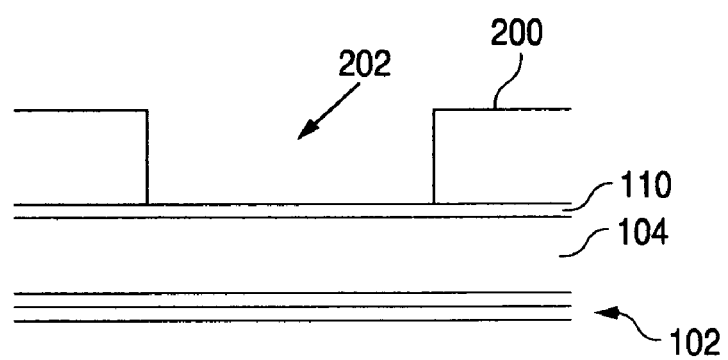
FIG. 2 shows a sectional side view of the interconnect of FIG. 1 after patterning the photoresist.

According to the invention, the aluminum base interconnect 100 is covered with photoresist 200, which is patterned using an extra mask (not shown) to define an exposed area 202 for forming the resistor as shown in FIG. 2, and is then etched as is discussed in greater detail below.

Figure 3:
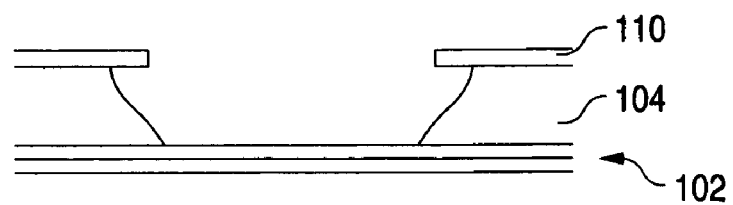
FIG. 3 shows an integrated resistor structure of one embodiment of the invention.

In order to remove the TiN ARC layer 110 a dry etch process is preferably used. Thereafter, the AlCu layer 104 is etched using a wet etch with high selectivity to Al as opposed to the TiN or TiW of the glue layer 102. In this embodiment, after the TiN ARC layer 110 is etched away, the AlCu layer 104 is etched away entirely, while the TiN glue layer 102 is not etched at all, as shown in FIG. 3. This results in a TiN/Ti resistor or glue layer resistor with a sheet resistance of about 200 Ω/s.q By etching away half of the 200 Å thick TiN layer of the glue layer 102, the sheet resistance of the remaining glue layer 102 is increased to 300 Ω/

It will, therefore, be appreciated that the present invention provides for a simple thin film resistor, the resistance of which can be adjusted not only by adjusting the length of the resistor using appropriate patterning of the aluminum interconnect, but also by adjusting the amount of etching of the glue layer 102. It will also be appreciated that low resistance resistors can be made using the same techniques and simply leaving some of the aluminum base material 104 during the wet etching of the AlCu.

What is claimed is:

1. A method of forming an integrated resistor of a defined resistance, comprising
    forming a metal base interconnect that includes a glue layer, a metal body and an ARC layer on a semiconductor material as part of an integrated circuit process,
    patterning the interconnect to define a resistor element of predefined length, and
    etching away the ARC layer and at least part of the metal body of the resistor element to a thickness that provides the defined resistance.

2. A method of claim 1, wherein the etching comprises etching away all of the metal body and etching away part of the glue layer to leave a glue layer of reduced thickness.

3. A method of claim 2, wherein the metal body comprises an aluminum body.

4. A method of claim 3, wherein the glue layer includes a TiN or TiW layer formed on top of a Ti layer.

5. A method of claim 4, wherein the Ti layer comprises a seeding layer that is 100 Å in thickness.

6. A method of claim 5, wherein the TiN or TiW layer comprises a 200 Å layer prior to etching.

7. A method of claim 6, wherein the ARC layer includes a TiN layer.

8. A method of claim 6, wherein the ARC layer is etched using a dry etch process.

9. A method of claim 8, wherein the aluminum body is etched using a wet etch process.

10. A method of claim 2, wherein the etching of the glue layer includes dry etching the glue layer to reduce the thickness of the glue layer.

11. A method of claim 3, wherein the etching of the glue layer includes etching away part of the TiN or TiW layer to define a TiN or TiW layer of reduced thickness.

12. A method of claim 11 wherein the etching of the TiN or TiW layer includes using a wet etch process.

13. A method of claim 1, wherein the aluminum body comprises AlCu material.

14. A method of claim 1, wherein the etching is preceded by a patterning step that includes depositing a photoresist and patterning the resistor section to define the length of the interconnect.

15. A method of forming an integrated resistor, comprising
 forming a metal base interconnect that includes a glue layer formed on a semiconductor material as part of an integrated circuit process,
 patterning the interconnect to define a resistor element, and
 etching away all of the layers of the interconnect formed on top of the glue layer to define a horizontally extending resistor.

16. A method of claim 15, further comprising etching away part of the glue layer.

17. A method of claim 15, wherein layers above the glue layer include a metal body that is etched away using a wet etch process.

18. A method of claim 17, wherein the layers above the glue layer, further include an ARC layer on top of the metal body, the ARC layer being etched away using a dry etch process.

19. A method of claim 18, wherein the metal body is AlCu, and the glue layer includes a Ti layer and a TiN or TiW layer.

* * * * *